United States Patent [19]

Murata et al.

[11] 4,233,591

[45] Nov. 11, 1980

[54] DIGITAL-TO-ANALOG CONVERTER OF THE PULSE WIDTH MODULATION TYPE

[75] Inventors: Toshinori Murata; Shigeo Matsuura; Hiroshi Miyamoto; Eisaku Akutsu, all of Yokohama, Japan

[73] Assignee: Hitachi, Ltd., Japan

[21] Appl. No.: 916,565

[22] Filed: Jun. 19, 1978

[30] Foreign Application Priority Data

Jun. 20, 1977 [JP] Japan .................................. 52-72055

[51] Int. Cl.³ ............................................ H03K 13/02
[52] U.S. Cl. ......................... 340/347 DA; 235/92 T; 235/92 TF; 235/92 FQ; 340/347 M; 455/179
[58] Field of Search .................. 340/347 M, 347 DA; 235/92 TF, 92 T; 325/464, 465

[56] References Cited

U.S. PATENT DOCUMENTS

| | | | |
|---|---|---|---|
| 4,087,813 | 5/1978 | Minner et al. ............... | 340/347 DA |
| 4,095,218 | 6/1978 | Crouse ........................... | 328/111 X |
| 4,096,475 | 6/1978 | Ong ............................... | 340/347 DA |
| 4,117,476 | 9/1978 | Koyanagi ..................... | 340/347 DA |

*Primary Examiner*—Thomas J. Sloyan
*Attorney, Agent, or Firm*—Craig & Antonelli

[57] ABSTRACT

A digital-to-analog converter of a pulse width modulation type in which a single counting cycle of a clock pulse counter is divided into $2^m$ elementary periods where m represents a selected number of less significant bits of a digital input data to be converted into analog quantity and elementary pulses in number determined in dependence on the logic values of the more significant bits are distributed among the elementary periods, while supplementary elementary pulses are produced in the elementary periods selected in dependence on the logic values of the less significant bits of the digital input data. These elementary pulses are integrated for every elementary period and the integrated output value is converted into a corresponding DC analog output signal.

26 Claims, 9 Drawing Figures

FIG. 5

```
                              15 0 1 2 3 4 5 6 7 8 9 10 11 12 13 14 15 0 1
(a) CLOCK PULSES              ⎍⎍⎍⎍⎍⎍⎍⎍⎍⎍⎍⎍⎍⎍⎍⎍⎍⎍⎍

Q4  1 0 0 0 0 0 0 0 0 1 1 1 1 1 1 1 1 0 0
                    Q3  1 0 0 0 0 1 1 1 1 0 0 0 0 1 1 1 1 0 0
                    Q2  1 0 0 1 1 0 0 1 1 0 0 1 1 0 0 1 1 0 0
                    Q1  1 0 1 0 1 0 1 0 1 0 1 0 1 0 1 0 1 0 1

(b) DIGITAL DATA INPUT  D4  0
                        D3  1     "5" IN DECIMAL NOTATION
                        D2  0→(1)
                        D1  1→(0)
```

(c) OUTPUT OF AND 103

(d) OUTPUT OF NOR 104

(e) OUTPUT OF COMPARATOR 1013

(f) Q-OUTPUT OF D-F.F. 1014'

(g) OUTPUT OF AND 1014"

(h) CARRY-OUT SIG. OF COUNTER 2

(i) Q-OUTPUT OF F.F. 102

(j) $\overline{Q}$-OUTPUT OF F.F. 102

(k) OUTPUT OF AND 105

(l) OUTPUT OF AND 106

(m) OUTPUT OF OR 107

(n) OUTPUT OF COMPARATOR 91

(o) Q-OUTPUT OF F.F. 5

DIGITAL-TO-ANALOG CONVERTER OF THE PULSE WIDTH MODULATION TYPE

BACKGROUND OF THE INVENTION

1. Field of the Invention

The present invention relates to a digital-to-analog converter (hereinafter referred to also as D-A converter in abridgement) for converting a digital signal into a corresponding analog signal.

2. Description of the Prior Art

In order to have a better understanding of the invention, description will be first made with respect to a hitherto known D-A converter with reference to FIG. 1 which is a block diagram showing a typical example of the prior art D-A converter of the pulse width modulation (PWM) type. For simplification of this description, it is assumed that each of the values of digital data to be converted into a corresponding analog quantity consists of four bits and thus the counter used for the conversion is also of four-bit capacity. In FIG. 1, reference numeral 1 denotes a clock pulse generator circuit for producing clock pulses which are counted by a counter 2 having a carry output C. All the bits of digital data $D_1$, $D_2$, $D_3$ and $D_4$ fed to digital input terminals 4a, 4b, 4c and 4d, respectively, are compared with all of the bits of the outputs $Q_4$, $Q_3$, $Q_2$ and $Q_1$ of the counter 2 through a comparator circuit 3. When coincidence is found, the comparator circuit 3 will produce a coincidence signal. An RS flip-flop 5 has a set input terminal S connected to the carry output terminal C of the counter 2 and a reset input terminal R connected to the output terminal of the comparator circuit 3 so as to be reset by the coincidence signal output from the comparator 3. The Q-output (non-inverted output) from the RS flip-flop 5 is connected to the input of an integrator circuit 6 to be converted into a corresponding analog signal which in turn is applied to the input of a voltage conversion circuit 7 adapted to produce a corresponding voltage signal at an analog voltage output terminal 8.

Next, the operation and the associated problems of the D-A converter of the prior art arrangement described above will be discussed with the aid of signal waveforms illustrated in the diagram of FIG. 2. The clock pulse generator circuit 1 produces clock pulses such as shown at (a) in FIG. 2, while the counter 2 counts 16 pulses labelled "0" to "15" during a single counting cycle or period. When the contents of the counter 2 becomes "0", the carry-out signal, such as shown at (b) in FIG. 2, is produced and supplied to the set input terminal S of a RS flip-flop 5 as the set signal. Under these conditions, when a digital data input, such as "0101" (which is equal to "5" according to the decimal notation), for example, which is to be converted into an analog quantity is applied to the digital input terminals 4d, 4c, 4b and 4a, then the input data is compared with the contents of the counter 2 by the comparator circuit 3, as result of which the coincidence signal, such as shown at (c) in FIG. 2, is produced at the time when the contents of the counter 2 becomes equal to "5". The coincidence signal is then supplied to the reset input R of the RS flip-flop 5 as a reset signal. Accordingly, the RS flip-flop 5 is set when the contents of the counter 2 is equal to zero and reset when the contents of the counter 2 is equal to "5". Consequently, the Q-output signal from the RS flip-flop 5 will be as shown at (d) in FIG. 2 during a single counting cycle or period of the counter 2. Generation of such a Q-output signal is subsequently repeated for every succeeding counting cycle or period of the counter 2. The Q-output signal is converted into a DC signal by the integrator circuit 6 and finally converted into a corresponding voltage value by the succeeding voltage converter stage 7.

If the number of clock pulses counted by the counter 2 during one period (a single counting cycle) is represented by N, the input data value applied to the input terminals 4d to 4a is represented by n and a reference voltage of the voltage converter circuit 7 is represented by $V_O$, then the voltage V produced at the analog signal output terminal 8 is given by the following expression:

$$V = n/N \cdot V_O$$

This means that the analog output signal voltage as obtained in proportional to the input digital data n.

In the D-A converter as described above, examination will next be made on the operation of the converter at the time when the input digital data value n undergoes variation. Referring to FIG. 3, it is assumed that a change occurs in the digital data value n at a given point in time T in the course of elapse of time t. The analog output voltage will then change during a finite time $\Delta t$, which imposes limits on the system for reasons described below:

So far as $t \leq T$, $n = n_1$, and when $T < t$, $n = n_2$, wherein $n_1 < n_2$. On the above assumption, the Q-output of the RS flip-flop 5 will of course change the waveform thereof at the boundary time T as is shown at (a) in FIG. 3. However, it will be noted that the output analog voltage will not instantly change in a step-like manner because of the time constant of the integrator circuit 6, but a transient delay time $\Delta t$ will intervene between the time T and the new steady level of the analog output voltage, as shown at (b) in FIG. 3. Such a delay time $\Delta t$ of course depends on the time constant of the integrator circuit 6 which time constant can not however be selected at an arbitrary small value in consideration of the fact that the function of the integrator circuit 6 is to integrate the waveform of the Q-output of the RS flip-flop 5 adequately so that the integrator output is free of any ripple component.

As will be appreciated from the above discussion, the hitherto known D-A converter has been disadvantageous in that the analog output thereof can not follow up a change or variation in the digital input data at a desirable high speed.

In an attempt to overcome the problem described above, there has been proposed a method according to which the digital input data is divided into a first group of more significant bits and a second group of less significant fits with the first data bit group being processed on the basis of pulse duration modulation (PDM), while the second data bit group is processed through pulse rate modulation (PRM). The processed outputs are then mixed together with each other.

The above method is however disadvantageous in that the circuit arrangement for carrying out the method will become necessarily complicated due to use of both PDM and PRM techniques. Besides, in the case of PRM, the number of pulses to be processed provides a critical problem in addition to the difficulty in attaining a stability of the output pulse due to the inherent pulse rise and fall characteristics of this system, as is known in the art.

SUMMARY OF THE INVENTION

Accordingly, an object of the invention is to provide an improved digital-to-analog or D-A converter which is immune to the drawbacks of the hitherto known D-A converter and in which the analog output signal can follow up variations or changes in the input digital data at a high speed.

Another object of the invention is to provide a D-A converter which allows the analog output signal to follow up changes in the digital data input at a high speed by adopting a pulse width modulation principle.

In view of the above and other objects which will become more apparent, the present invention teaches that the duration of width of each of the output pulses produced in response to the digital input data in a single counting cycle of a counter and to be subsequently integrated is divided into a number of elementary pulses with the total width thereof being equal to the width of the original pulse. The elementary pulses thus obtained are distributed over a period corresponding to the single counting cycle of the counter thereby to increase the pulse repetition rate or frequency. Thus, the time constant of the succeeding integrator circuit can be made smaller, which in turn allows the analog output to follow up changes in the digital input more quickly.

In a D-A converter of the PWM type according to an embodiment of the invention, a single counting cycle of the counter is divided into m elementary periods where m represents a preselected number of less significant bits of the digital input data, and the elementary pulses are distributed among the elementary periods in number depending on the logic values of the more significant bits of the digital input data, while supplementary elementary pulses are additionally placed in the elementary periods selectively determined in dependence on the values of the less significant bits of the digital input data.

In this manner, the repetition frequency of the digital output pulses produced during the single counting cycle is virtually converted into the repetition rate of the elementary periods which is $2^m$ times as high as the former. Thus, the time constant of the succeeding integrator circuit can be made smaller to enhance the response speed of the analog output to the change or variation in the digital input data.

Additionally, since the speed-up of the response of the analog output signal to the variation in the digital input data is effected only on the basis of pulse width modulation, the circuit arrangement can be significantly simplified over the hitherto known converter of the combined PDM and PRM type, while the stability of the pulse which is an advantage of PWM can be effectively retained.

BRIEF DESCRIPTION OF THE DRAWINGS

FIG. 5 shows signal waveform diagram to illustrate operation of the D-A converter shown in FIG. 4.

DESCRIPTION OF THE PREFERRED EMBODIMENTS

Figure 4:
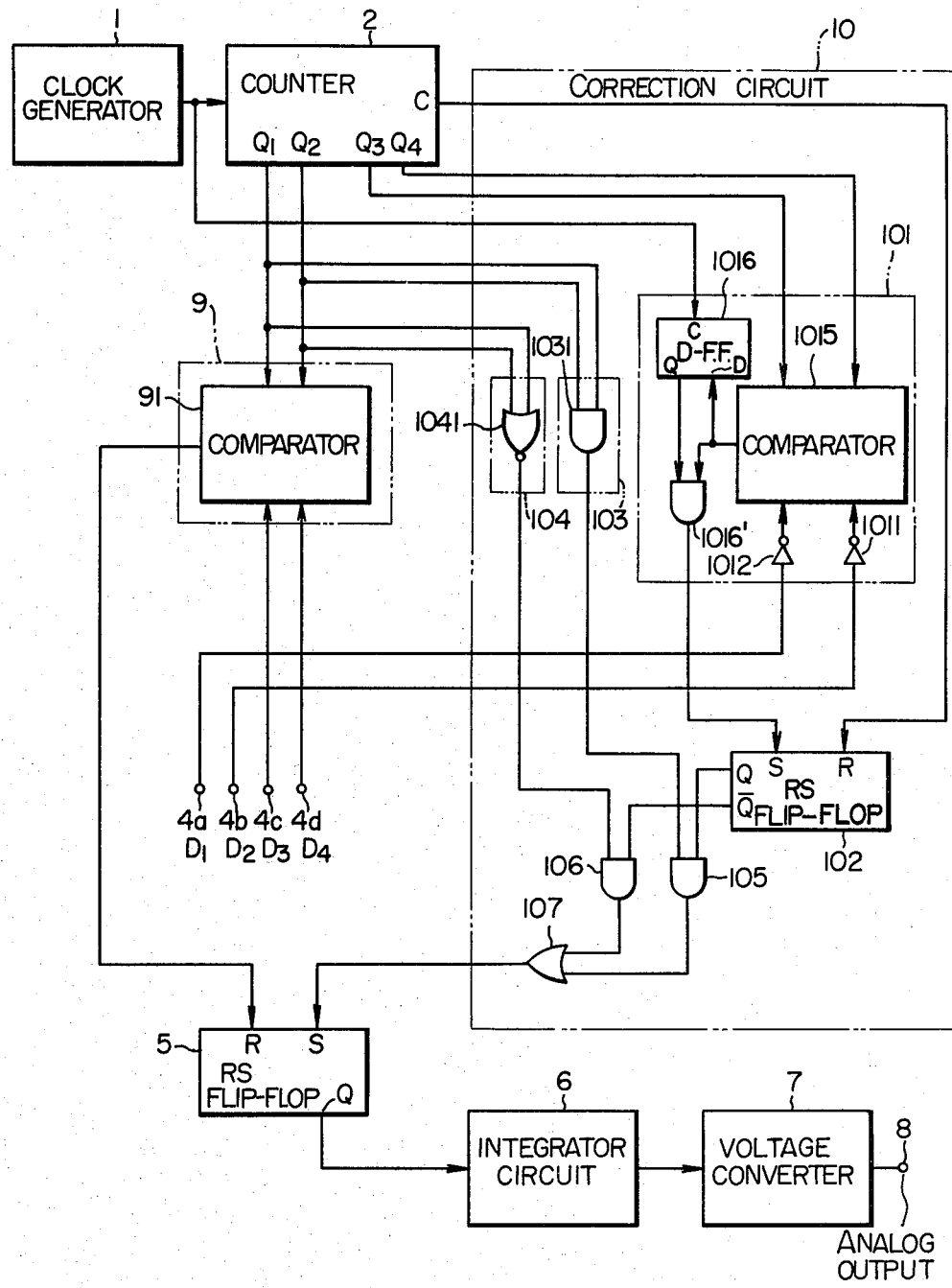
FIG. 4 is a block diagram showing an exemplary embodiment of the digital-to-analog or D-A converter according to the invention.

Referring to FIG. 4 which is a block diagram showing an exemplary embodiment of a digital-to-analog or D-A converter according to the present invention, the output of a clock pulse generator 1 is coupled to a counter 2 for counting the clock pulse and having a carry signal output terminal C at which the carry-out signal is produced when the contents of the counter 2 becomes zero or "0". The counter 2 is of four bit capacity, the most significant digit or MSD of which is represented by $Q_4$, while the least significant digit or LSD is represented by $Q_1$. A digital input signal to be converted into the corresponding analog signal is applied to the digital data input terminals 4a, 4b, 4c and 4d and is composed of four bits, of which MSD is represented by $D_4$ with LSD being represented by $D_1$. Reference numeral 5 denotes a RS flip-flop having a set input S, a reset input R and a Q-output terminal (non-inverted output terminal) to which an integrator circuit 6 is connected for integrating the Q-output (digital value) from the RS flip-flop 5 thereby to produce a corresponding analog value. The analog output from the integrator circuit 6 is connected to a voltage converter 7 having its output connected to a terminal 8 which constitutes the analog output terminal of the D-A converter. A circuit 9 is provided which has first input terminals connected to less significant bit outputs $Q_1$ and $Q_2$ of the counter and second input terminals connected to the more significant bit digital data terminals 4d and 4c, while the output of the circuit 9 is connected to the reset input terminal R of the RS flip-flop 5. The circuit 9 serves to divide a single counting cycle or a period of the counter 2 into $2^m$ elementary periods $S_1$ to $S_4$ (refer to FIG. 5) where m represents the number of bits in the less significant bit group 4b; 4a (in the case of the illustrated embodiment, m=2 since there are two elementary bits and thus the number of the elementary periods is equal to 4) nd further serves to allocate pulses in number corresponding to the value of the data bits $D_4$ and $D_3$ at the more significant bit input terminals 4d and 4c to each of the elementary periods $S_1$ to $S_4$. The circuit 9 includes a comparator 91 which receives the less significant bits $Q_2$; $Q_1$ of the counter 2 a first inputs and the more significant bits $D_3$; $D_4$ from the digital data input terminals 4c and 4d as second inputs thereby to compare the first and second inputs with each other and produce a pulse signal upon coincidence being found in the comparison, which pulse signal is then applied to the reset input terminal R of the flip-flop 5. The broken-line block 10 denotes a correction elementary pulse circuit which has inputs connected to the more significant bit terminals $Q_4$; $Q_3$, to the less significant bit terminals $Q_2$; $Q_1$ and to the carry-out output terminal C of the counter 2 and to the more significant bit terminals 4b; 4a of the digital input terminals. The output from the circuit 10 is connected to the set terminal S of the RS flip-flop 5. The correction elementary pulse circuit 10 serves to allot elementary pulses for correction to selected ones of the elementary periods in dependence on the values of the less significant data bits $D_1$; $D_2$ of the digital data input terminals. To this end, the circuit 10 includes a comparator circuit 101 having inputs connected to the less significant bit terminals 4b; 4a of the digital data input terminals and to the more significant bit terminals $Q_4$; $Q_3$ of the counter 2 for the comparison thereof. When coincidence is found between these sets of input bits, the comparator circuit 101 produces a coincidence signal pulse which is then applied to an RS flip-flop 102 at the set terminal S thereof. The RS flip-flop 102 has a reset terminal R connected to the carry-out terminal C of the counter 2. The circuit 10 further includes a comparator 103 which receives the less significant bits $Q_2$; $Q_1$ of the counter 2 as an input and produces an output signal when these bits all take a certain predetermined value, such as all "1's". This comparator 103 will be thus referred to as the all-"1"-comparator and may be constituted by AND gate 1031. On the other hand, a so-called all-"0"-comparator 104 is provided which has inputs connected to the less significant bits $Q_2$ and $Q_1$ and is adapted to produce an output signal when these input bits $Q_2$ and $Q_1$ all take a certain predetermined value, such as logic "0". This comparator 104 may be constituted by NOR gate 1041. The circuit 10 further includes an AND gate 105 having inputs connected to the non-inverted or Q-output terminal of the flip-flop 102 and the output terminal of the all-"1"-comparator 103, respectively, and is adapted to produce a number of output pulses in dependence on the less significant bit values $D_2$ and $D_1$ at the digital data input terminals 4b and 4a. For example, the AND gate 105 produces a single output pulse when the data bits $D_2$ and $D_1$ are all logic "0", two output pulses in response to the logic "0" and "1" of the data bits $D_2$ and $D_1$, three output pulses in response to logic "1" and "0" of data bits $D_2$ and $D_1$, and four output pulses in response to logic "1" and "1" of data bits $D_2$ and $D_1$, respectively. In contrast, there is provided an AND gate 106 which has inputs connected to the inverted or $\overline{Q}$-output of the flip-flop 102 and the output terminal of the all-"0"-comparator 104 and is adapted to produce a number of output pulses in dependence on the less significant data bits $D_2$ and $D_1$ at the digital data input terminals 4b and 4a, e.g. four output pulses are produced when data bits $D_2$ and $D_1$ are logic "0" and "0", three pulses are produced in response to logic "0" and "1" of data bits $D_2$ and $D_1$, two output pulses are produced in response to logic "1" and "0" of data bits $D_2$ and $D_1$, and a single pulse is produced when data bits $D_2$ and $D_1$ are logic "1" and "1", respectively. An OR gate 107 is provided which has inputs connected to the output terminals of the AND gates 105 and 106, and an output connected to the set input terminal S of the RS flip-flop 5. The outputs from the all-"1"-comparator 103 and the all-"0"-comparator 104 are utilized to define the beginning and the end of the individual elementary period. Of course, other means may be employed to the same effect. The comparator circuit 101 includes a comparator 1015 having first inputs connected to the less significant bit terminals 4b and 4a of the digital data input terminals through inverters 1011 and 1012 for inverting the data bits $D_2$ and $D_1$, respectively, and second inputs connected to the more significant bit terminal $Q_4$ and $Q_3$ of the counter 2 for comparing the first and the second input signals with each other, whereby output pulses are produced when coincidence is found in the comparison. For example, when the digital data inputs $D_2$ and $D_1$ are "0" and "1", respectively, the comparator 1015 produces output pulses during the times when the more significant bit outputs $Q_4$ and $Q_3$ of the counter 2 are in the logic states "1" and "0", respectively. The inverters 1011 and 1012 may be alternatively provided between the counter 2 and the comparator 1015. The output of the comparator 1015 is connected to the input of a delay circuit 1016 which serves to delay only the leading edge of the output pulse from the comparator 1015 for a predetermined time (e.g. duration of one clock pulse), thereby to assure that the AND gates 105 and 106 produce the predetermined output pulses without failure. The delay circuit 1016 comprises a D flip-flop having inputs C and D connected to the output of the clock pulse generator 1 and the output of the comparator 1015 and an AND gate 1016' having inputs connected to the Q-output of the D flip-flop 1016 and the output of the comparator 1015. The output of the AND gate 1016' is connected to the set input S of the RS flip-flop 102. In this connection, it should be mentioned that the delay circuit 1016 is not necessarily required. In practice, if some ripple component is allowable in the output signal from the integrator circuit 6, the delay circuit 1016 may be omitted. Further, although the flip-flop 102 is so connected that it is set by the output from the comparator circuit 101 and reset by the carry-out output from the counter 2, it is also possible to reverse such connection.

Next, operations of the D-A converter shown in FIG. 4 will be described with the aid of signal diagrams shown in FIG. 5, in which output signal waveforms at the main circuit components are illustrated for one count cycle or period of the counter 2 on the assumption that the input digital data $D_4$, $D_3$, $D_2$ and $D_1$ corresponds to "0", "1", "0" and "1", respectively, which represents "5" in decimal notation. In FIG. 5, the clock pulse waveform produced from the clock pulse generator 1 is illustrated at (a), while the digital input data is illustrated at (b). Under these conditions, the all-"1"-comparator 103 and the all-"0"-comparator 104 produce output signals having waveforms illustrated at (c) and (d), respectively, in dependence on whether the less significant bits $Q_2$ and $Q_1$ of the counter 2 are simultaneously "1's" or "0's". The comparator 1015 will produce an output signal of the waveform shown at (e) when the more significant bits $Q_4$ and $Q_3$ of the counter 2 are logic "1" and "0", respectively, since the less significant data bits $D_2$ and $D_1$ at the digital input terminals 4b and 4a are logic "0" and "1" from the above assumption. In response to the output signal of the comparator 1015 and the clock pulse from the clock generator 1 applied to the inputs D and C of the D flip-flop 1016, the latter will produce Q-output (non-inverted output) signal of the waveform shown at (f) in FIG. 5, which is then applied to the AND gate 1016' together with the output of the comparator 1015 (waveform (e)), resulting in the output signal of the waveform (g) from the AND gate 1016'. The RS flip-flop 102 is set by the output signal (g) from the AND gate 1016' and reset by the carry-out signal of the waveform (h) from the counter 2, thereby to produce output signals of the waveforms shown at (i) and (j) in the set and reset states, respectively. The inverted or $\overline{Q}$ output (j) from the RS flip-flop 102 is applied to the AND gate 106 together with an output of the waveform (d) from the all-"0"-comparator or NOR gate 104, resulting in the output signal having the waveform shown at (l) from the gate 106 in accordance with the logic values of the less significant bit data $D_2$ and $D_1$ of the digital input. On the other hand, AND gate 105 receives at the inputs thereof the output signal (c) from the all-"1"-comparator 103 and the Q-output signal (i) from the RS flip-flop 102, whereby a pulse signal of the waveform shown at (k) in FIG. 5 is produced in accordance with the less significant bit data $D_2$ and $D_1$ of the digital input data and is derived as the output signal from the flip-flop 5 to be utilized as the supplementary correction pulse, as described hereinafter. The outputs from AND gates 105 and 106 are input to OR gate 107, resulting in the generation of the logical sum signal of the waveform (m).

On the other hand, the comparator 91 produces a pulse signal in accordance with the more significant bit data $D_4$ and $D_3$ at the digital data input terminals 4d and 4c. Since the data bits $D_4$ and $D_3$ are logic "0" and "1" from the above assumption, the comparator 91 produces an output signal having a waveform shown at (n) in FIG. 5 during the time when the less significant bit outputs $Q_2$ and $Q_1$ of the counter 2 are logic "0" and "1", respectively.

The RS flip-flop 5 is set by the output signal (m) from OR gate 107 and reset by the output signal (n) from the comparator 91, thereby to produce output signal of the waveform shown at (o) in FIG. 5.

In this manner, when the output from the OR gate 107 is utilized as the set signal for the RS flip-flop 5 while the output from the comparator 91 is used as the reset signal, then the output signal pulses from the RS flip-flop 5 will be distributed among the $2^2$ elementary or sub-periods $S_1$ to $S_4$ (the number of which are determined by the less significant bit number of the digital input data, i.e. two bits $D_2$ and $D_1$ at the input terminals 4b and 4a in the illustrated embodiment) as the pulses having durations which in turn depend on the logical values of the more significant data bits $D_4$ and $D_3$. More particularly, when the more significant bits $D_4$ and $D_3$ are logic "0" and "1", the distributed pulse has a unit width of an elementary pulse, as indicated by pulses $P_1$ to $P_4$ in FIG. 5. When the bits $D_4$ and $D_3$ are logic "1" and "0", the distributed pulse will have a pulse width equal to a sum of two elementary pulses. When the bits $D_4$ and $D_3$ are both logic "0's", no elementary pulse is present. For the logic states "1" and "1" of the bits $D_4$ and $D_3$, the distributed pulse will have the pulse width equal to a sum of three elementary pulses. The output signals from the RS flip-flop 5 during the elementary or sub-periods $S_4$ and $S_3$ are supplementarily corrected in dependence on the contents or logic values of the less significant bits by adding the output pulses from the AND gate 105 to the output of gate 106. The distribution of the output pulses described above is determined by the logic values or states of the more significant bits of the digital data input and effected by the output signal from the comparator 91. On the other hand, the supplementary correction of the output signal from the flip-flop 5 depends on the logic value of the less significant bits of the digital data input and effected by the output pulse from the AND gate 105. For example, when the less significant bits $D_2$ and $D_1$ are both logic "0's", a single correction pulse is supplemented during the elementary period $S_4$. When the bits $D_2$ and $D_1$ are logic "0" and "1", two correction pulses $P_4'$ and $P_3'$ are added during the elementary periods $S_4$ and $S_3$, respectively. In the illustrated embodiment, when the less significant bits are logic "0,0"; "0,1"; "1,0" and "1,1", correction pulses are supplementarily allotted to the elementary periods $S_4$; $S_4$, $S_3$; $S_4$, $S_3$, $S_2$; and $S_4$, $S_3$, $S_2$, $S_1$, respectively. However, it will be appreciated that such relation may be reversed.

It is to be noted that, when the delay circuit 1016 is omitted, the third pulse $P_3$ will then be absent in the output signal from RS flip-flop 5, involving a correspondingly increased ripple component.

Figure 2:
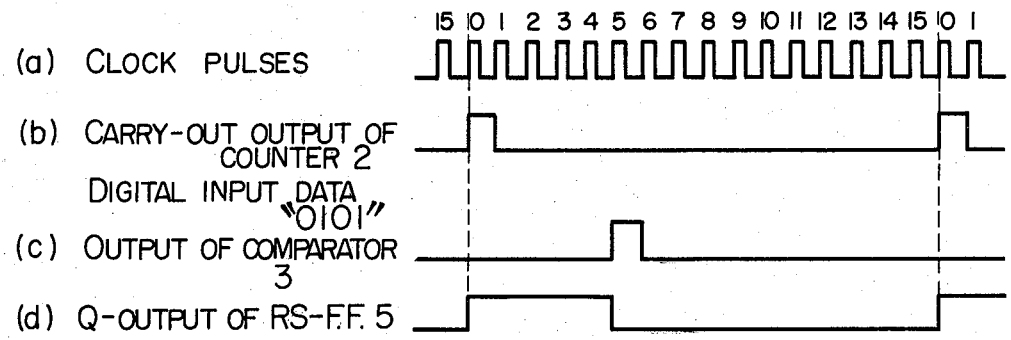
FIGS. 2 and 3 show signal waveform diagrams to illustrate operation of the D-A converter shown in FIG. 1.
Figure 3:
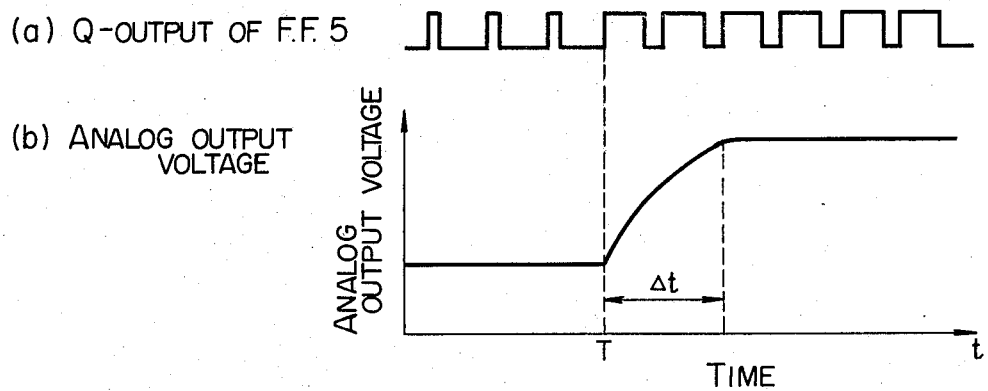

From the foregoing description, it will be appreciated that the circuit shown in FIG. 4 can produce four output pulses as shown at (o) in FIG. 5 during a single counting cycle of the counter 2 for the digital input data "0101", whereby the pulse repetition frequency is made four times as high as that of the hitherto known circuit which can produce only one output pulse as shown at (d) in FIG. 2 under the same conditions.

Figure 1:
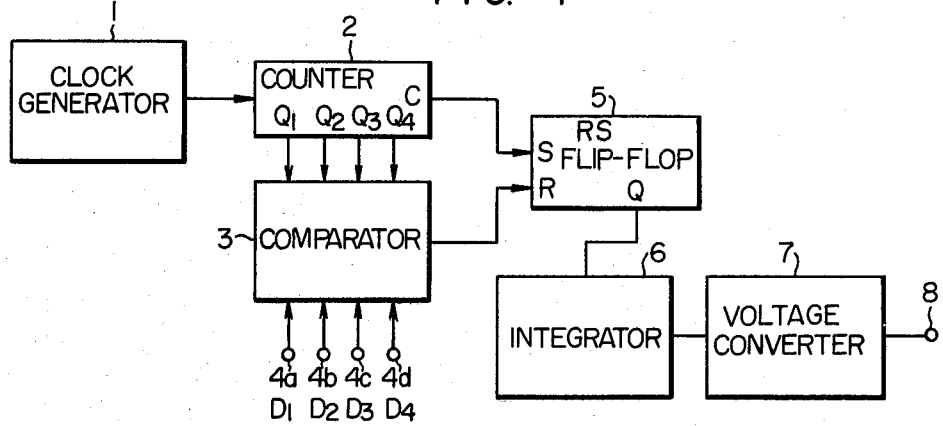
FIG. 1 is a block diagram showing a typical example of hitherto known D-A converters.

By way of example, it is assumed that the four-bit counter is employed in combination with the clock generator producing the clock pulse signal P of 2 MHz. Then, for the digital input data "0101", the output pulse repetition frequency $f_1$ of the hitherto known system shown in FIG. 1 is calculated as follows:

$$f_1 = \frac{P}{2^4} = \frac{2 \times 10^6}{16} = 125 \, KHz$$

In contrast, the output pulse repetition frequency $f_2$ attained in the system according to the invention is equal to 500 KHz as is obvious from the following calculation:

$$f_2 = \frac{P}{2^2} = \frac{2 \times 10^6}{4} = 500 \, KHz$$

This means that the output pulse repetition frequency $f_2$ attained according to the invention is four times as high as the one attained in the hitherto known circuit such as shown in FIG. 1.

The repetition frequency will vary in dependence on the contents of the digital input data.

The increased pulse repetition frequency will then allow the time constant of the succeeding integrator circuit 6 to be made smaller as compared with the one allowable in the prior art circuit while the ripple component is suppressed within a tolerable range. Thus, it is possible to cause the analog output to follow any variation in the digital input data at a high speed.

The above described embodiment is suited for use in the system in which the digital input data is in a predetermined range of values, e.g. in the range of "0100" to "1011" of the four-bit input data. That is, in the practical embodiment of FIG. 4, in the case where the digital input data is out of the above-mentioned range, the output of the OR gate 107 is synchronized with the output of the comparator 91, the former being applied to the set input terminals of the flip-flop 5 and the latter being applied to the reset input terminals of the flip-flop 5, with the result that the output waveform of the flip-flop 5 is not uniquely specified by the input timing at that time. Therefore, a malfunction may result.

In short, in the practical embodiment of FIG. 4, any desired specific outputs to the digital input data in the range of "0000-0011" may result in a malfunction, and in the range "1100-1111" correct conversion cannot be obtained.

However, when the digital data is used in the specific range of "0100-1011", there is no problem in practically converting the digital data. For example, when a D-A converted output is used as the tuning voltage in a television channel selection apparatus, the ratio of the digital input to the analog output corresponds to 1:1. When the former is almost in proportion to the latter, the analog output (the tuning voltage) becomes minimum in the case of the digital input data "0100" and the analog output becomes maximum in the case of the digital input data "1011" by specifying the useful range (the tuning voltage) within the available values. In order to assure a satisfactory operation without erroneous operation in the other ranges of the digital input data such as "0000" to "0011" and "1100" to "1111", that is, in the case where the operation is desired over the entire range of the digital input data "0000–1111", it is necessary to provide a priority means for selecting with priority either the set input or reset input of the flip-flop 5 as supplied from the outputs of the OR gate 107 and the comparator 91, when both inputs are produced simultaneously.

Figure 6:
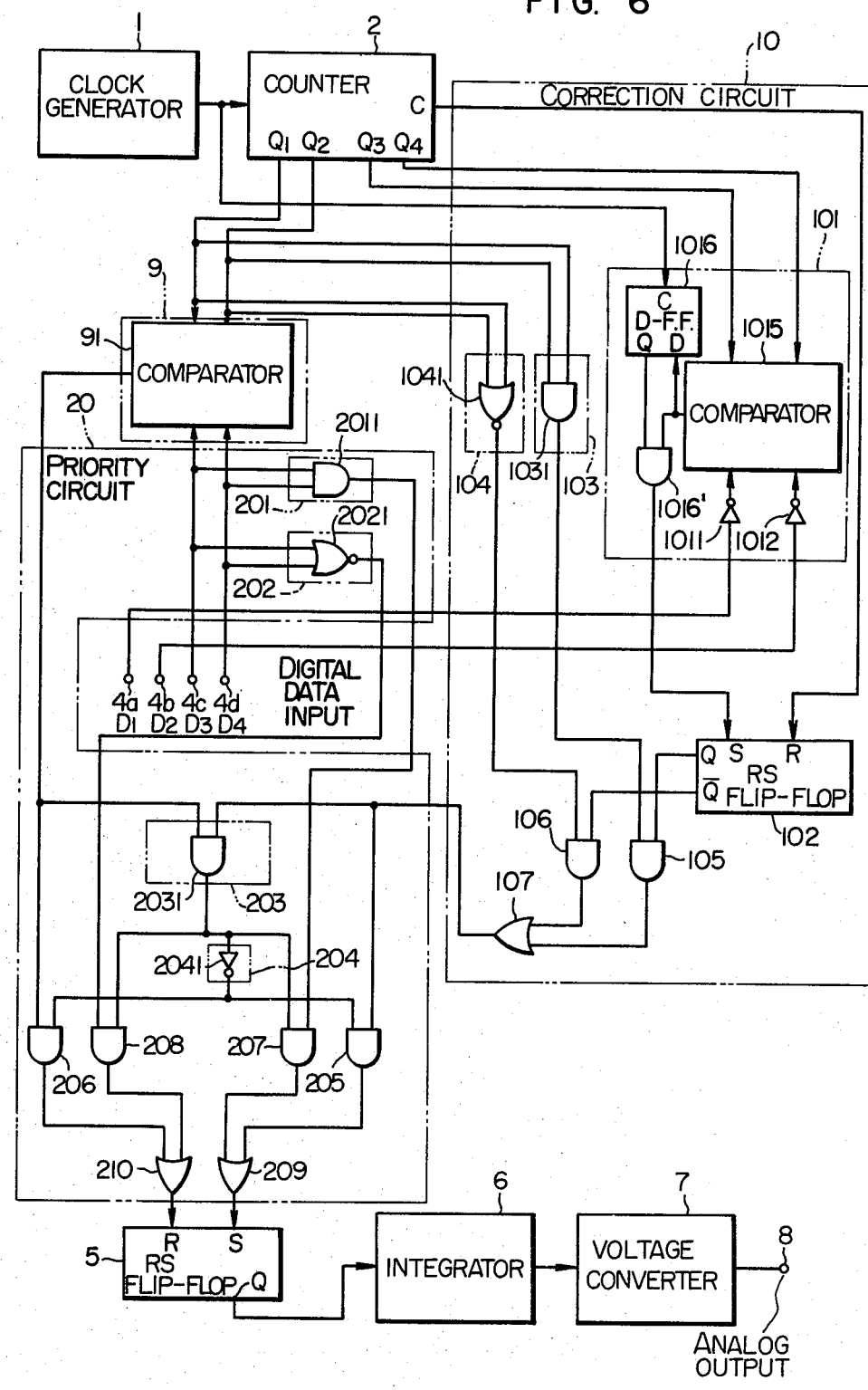
FIG. 6 is a block diagram showing another exemplary embodiment of the D-A converter according to the invention.

FIG. 6 is a circuit diagram showing the D-A converter according to another embodiment of the invention which is different from the one shown in FIG. 4 in that the priority circuit described above is additionally incorporated. In FIG. 6, the like components as those shown in FIG. 4 are denoted by the same reference numerals and the repeated description of such components will be omitted.

Referring to FIG. 6, the priority circuit represented by a broken line block 20 and having inputs connected to the outputs of the circuits 9 and 10 as well as to the more significant bit terminals 4d and 4c of the digital data input and outputs connected to the set and the reset terminals of the flip-flop 5 will become operative when the digital input data $D_4$–$D_1$ at the input terminals 4d to 4a is in the ranges of logic "0000" to "0011" and "1100" to "1111". The priority circuit 20 includes a so-called all-"1"-comparator 201 having inputs connected to the more significant bit terminals 4d and 4c, respectively, and adapted to produce an output signal when the more significant input bits $D_4$ and $D_3$ take first predetermined logic values such as all "1's". This comparator 201 may be constituted by an AND gate 2011. On the other hand, an all-"0"-comparator 202 is provided which has inputs connected to the more significant bit input terminals 4d and 4c, respectively, and is adapted to produce an output signal when the more significant bits $D_4$ and $D_3$ take second predetermined values such as all "0's". The all-"0"-comparator may be constituted by NOR gate 2021. Additionally, a simultaneous signal detector 203 is provided which has inputs connected to the outputs of the comparator 91 of the first circuit 9 and the OR gate 107 of the second circuit means, respectively, and which is adapted to produce an output signal when the outputs from the comparator 91 and the OR gate 107 are simultaneously produced. The detector 203 may consist of an AND gate 2031, for example. An AND gate 205 is provided which has inputs connected to the output of the detector 203 through an inverter 204 which may consist of an inverter 2041 and is connected to the output of the OR gate 107 of the second circuit means 10, respectively. The priority circuit 20 further includes an AND gate 206 having inputs connected to the outputs of the inverter 204 and the comparator 91 of the first circuit means 9, respectively, an AND gate 207 having inputs connected to the outputs of the all-"1"-comparator 201 and the simultaneous signal generation detector 203, respectively, an AND gate 208 having inputs connected to the outputs of the all-"0"-compara-tor 202 and the simultaneous signal detector 203, respectively, an OR gate 209 having inputs connected to the outputs of the AND gates 205 and 207, respectively, and an output connected to the set input S of the flip-flop 5, and an OR gate 210 having inputs connected to the outputs of AND gates 206 and 208, respectively, and an output connected to the reset input R of the flip-flop 5.

Figure 7:
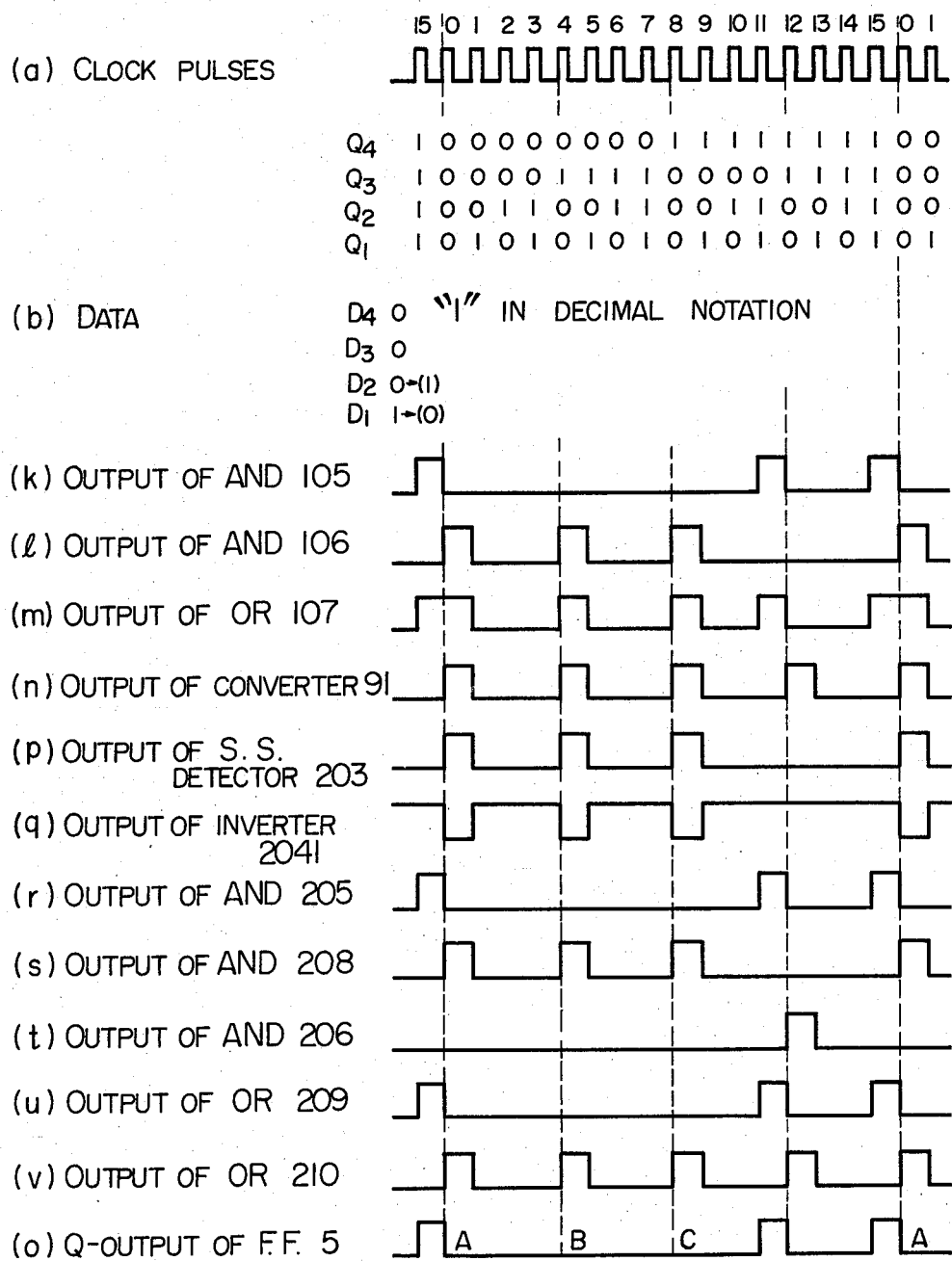
FIG. 7 shows signal waveform diagrams to illustrate operation of the D-A converter shown in FIG. 6.

Now, the operation of the priority or preference circuit 20 will be described with reference to FIG. 7 which shows signal waveform diagrams of output signals produced by the main circuit components shown in FIG. 6 during a single counting cycle or period of the counter 2 on the assumption that the input digital data $D_4$ to $D_1$ is "0001" ("1" in the decimal notation). Under the stated conditions, the output signals from the all-"1"-comparator 103 and the all-"0"-comparator 104 as well as the carry output signal of the counter 2 have the same respective waveforms as those shown in FIG. 5. Further, since the digital data bits $D_2$ and $D_1$ are logic "0" and "1", respectively, the output signal from the comparator 1015 will be of the same waveform as the one shown in FIG. 5. Consequently, the Q- and $\overline{Q}$-outputs of the flip-flop 102 as well as the outputs from the AND gates 105 and 106 and the OR gate 107 are also of the same waveform as those shown in FIG. 5. In FIG. 7, the outputs from the AND gates 105 and 106 and the OR gate 107 are shown at (k), (l) and (m), respectively. Because the digital data bits $D_4$ and $D_3$ are both "0's", the comparator 91 will produce an output signal having a waveform as shown at (n) in FIG. 7, when the outputs $Q_2$ and $Q_1$ of the counter 2 are both "0's". The simultaneous signal detector circuit 203 will produce an output signal having a waveform as shown at (p), when the output of the waveform (m) from OR gate 107 appears simultaneously with the output signal (n) from the comparator 91. The output (p) from the detector circuit 203 is inverted by the inverter 2041 into the waveform shown at (q) in FIG. 7. The AND gate 205 responds then to the output signal (q) of the inverter 2041 and the output signal (m) of OR gate 107 thereby to output a logical product signal having a waveform as shown at (r) in FIG. 7. As will be apparent from the waveform (r), among the output signals from the AND gates 105 and 106 applied to the set input of the RS flip-flop 5, the signal which is produced simultaneously with the output signal from the comparator 91 applied to the reset input R of the flip-flop 5 has been eliminated. Since the digital data bits $D_4$ and $D_3$ are both logic "0's", the output of the all-"1"-comparator 201 will be at the logic "0" level, resulting in no output from the AND gate 207. Consequently, the output signal of the waveform (r) from the AND gate 205 will be applied to the set input terminal S of the flip-flop 5 through OR gate 209. Further, the output of the all-"0"-comparator 202 is at the logic level "1" because of the digital bits $D_4$ and $D_3$ being both logic "0's". Thus, as the result of the AND function of the gate 208 between the output from the all-"0"-comparator 202 and the output signal (p) from the simultaneous signal detector circuit 203, only one of the reset signals (n) applied to the RS flip-flop 5 that appears in coincidence with the set signal (m) will be produced from the AND gate 208, as is shown at (s) in FIG. 7. Further, through the AND function of the gate 206 between the output signal (n) from the comparator 91 and the output (q), only one of the reset signals (n) that appears out of coincidence with the set signal (m) is produced from the AND gate 206, as is shown at (t) in FIG. 7. The output signals of the OR gates 209 and 210 are illustrated at (u) and (v), respectively, in FIG. 7.

In this manner, the reset signal applied to the RS flip-flop 5 will take the waveform shown at (v) in FIG. 7 and produce an output signal having a waveform as shown at (o) in which A, B and C represent that the reset signals are selected with preference over the simultaneously produced set signals at these points in time.

In the foregoing description, it has been assumed that the first two more significant bits $D_4$ and $D_3$ of the digital input data are both logic "0's". When both of these bits $D_4$ and $D_3$ are logic "1's", then the set signal is selected with priority or preference over the reset signal.

In the D-A converter circuit shown in FIG. 6, when the output (m) from OR gate 107 is not produced simultaneously with the output signal (n) of the comparator 91 (e.g. when the digital input data $D_4$ to $D_1$ is "0101"), the simultaneous signal detector circuit 203 remains inoperative. Then, the outputs of AND gates 207 and 208 will be both logic "0's", resulting in the logic "1" output from the inverter 204, whereby the AND gates 205 and 206 are in the conductive state. Consequently, the flip-flop 5 is applied at the set input terminal S with the output signal (m) from the OR gate 107, while the output (n) from the comparator 91 will be applied to the reset input terminal R of the flip-flop 5, which will then produce an output signal having a waveform as shown at (o) in FIG. 5.

Figure 8:
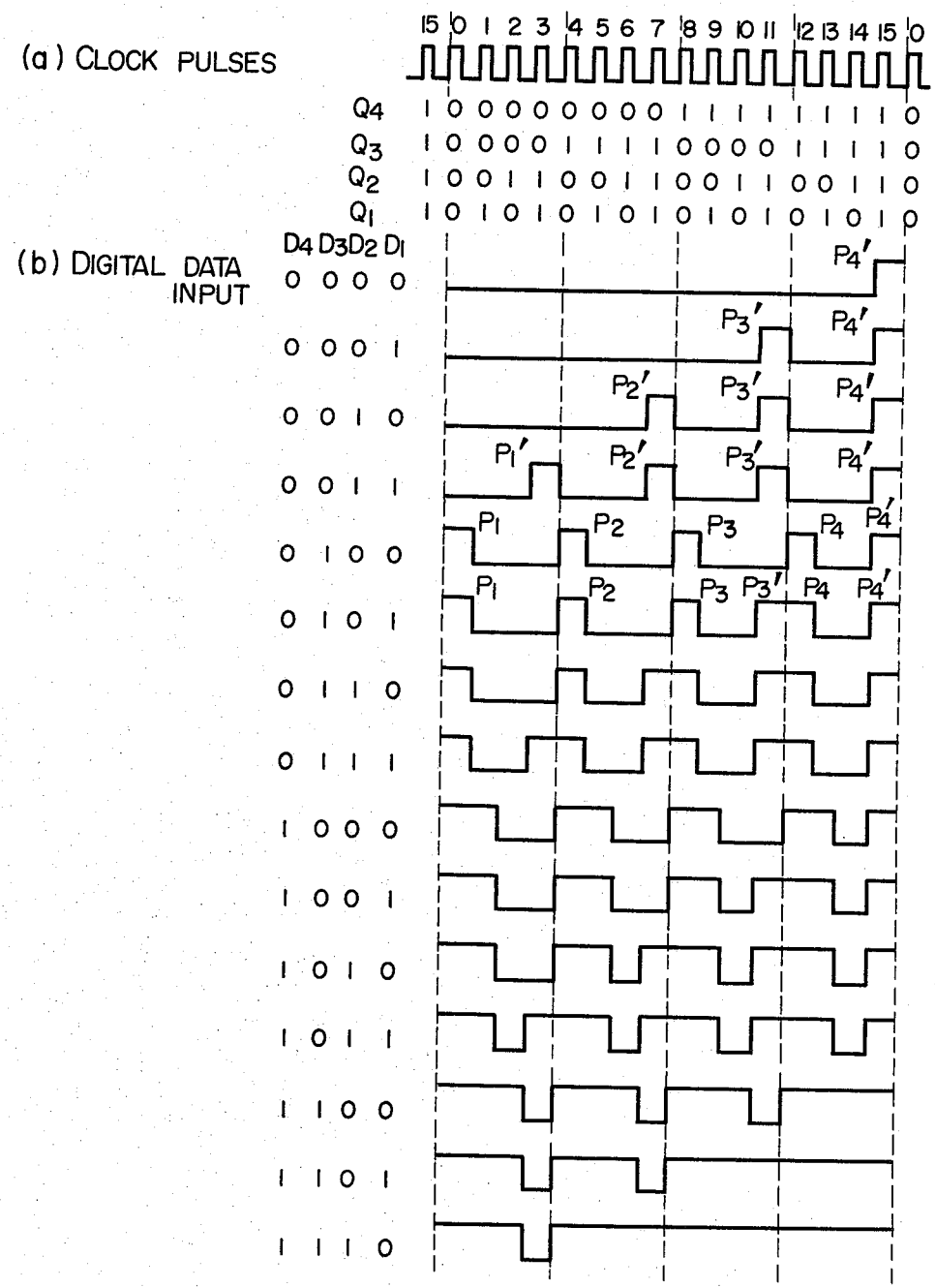
FIG. 8 shows signal waveforms of the output signals produced from certain circuits shown in FIGS. 4 and 6.

In summary, FIG. 8 illustrates waveforms of the Q-outputs of the RS flip-flop 5 with the digital input data $D_4$, $D_3$, $D_2$, $D_1$ being increased in the sequence "0000", "0001", "0010", "0011", "0100", "0101", "0110", ..., and "1110" ("0", "1", "2", "3", "4", "5", ..., and "14" in the decimal notation). In FIG. 8, reference letters $P_1$ to $P_4$ denote the output pulses distributed among the individual elementary sub-periods $S_1$ to $S_4$ through the operation of the first circuit means 9, while $P_1'$ to $P_4'$ denotes supplement pulses produced by the second circuit means 10.

Figure 9:
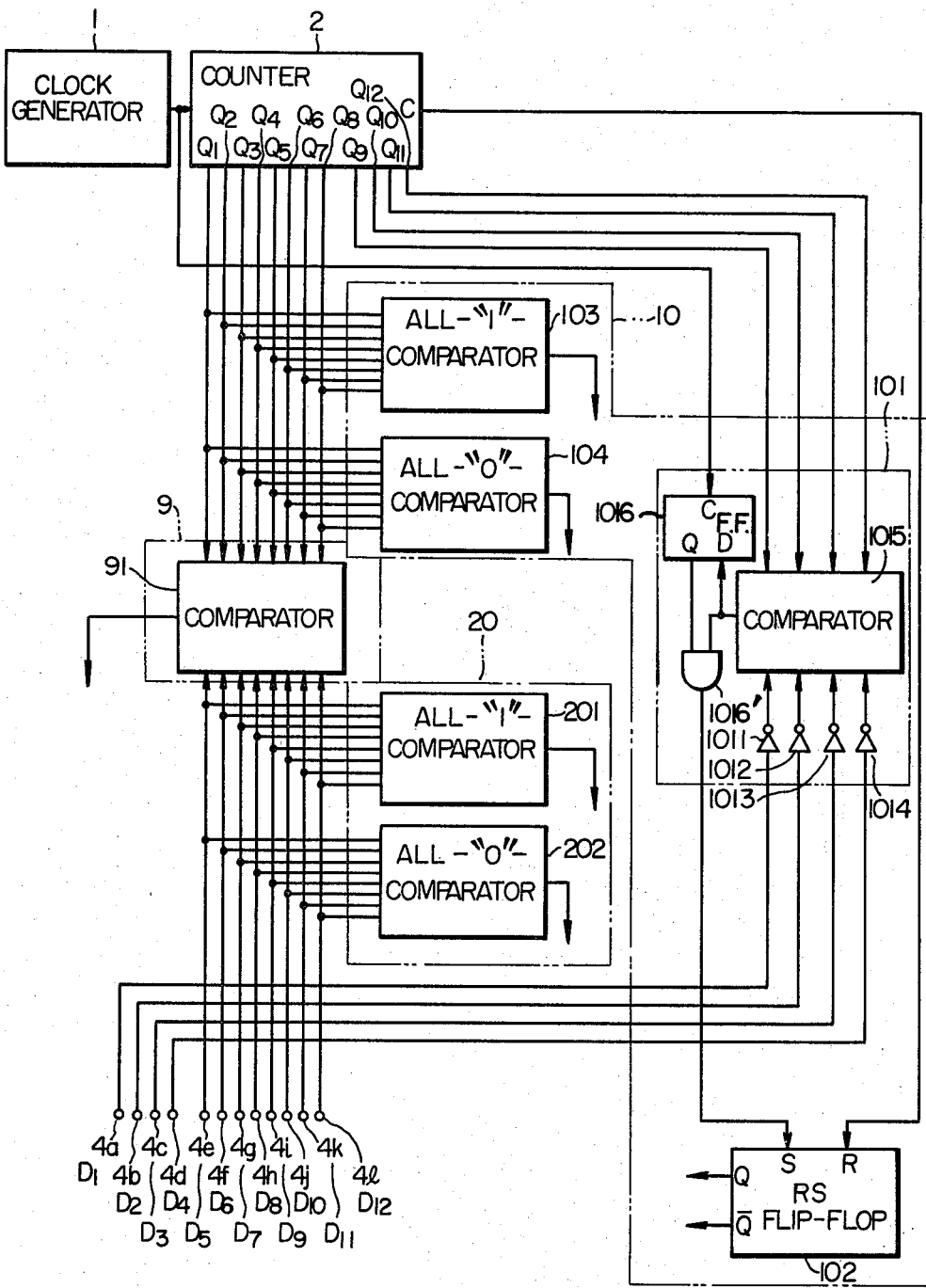
FIG. 9 is a block diagram showing still another embodiment of the D-A converter according to the invention.

FIG. 9 shows a D-A converter incorporating a 12-bit counter to which the invention is applied. The bits $Q_1$ to $Q_{12}$ of the counter 2 are divided into two groups of eight less significant bits $Q_1$ to $Q_8$ and four more significant bits $Q_9$ to $Q_{12}$. In this figure, reference numeral 2 denotes the 12-bit counter having the most significant bit or MSB $Q_{12}$ and the least significant bit or LSB $Q_1$; $4a$ to $4l$ denotes digital data input terminals for the input data bits having MSB $D_{12}$ and LSB $D_1$; 91 denotes a comparator for comparing the eight less significant bits $Q_1$ to $Q_8$ of the counter with the eight more significant data bits $D_{12}$ to $D_5$ thereby to produce a coincidence output signal when coincidence occurs in the comparison; 101 designates a comparator circuit including a comparator 1015 for comparing the four more significant bit outputs $Q_9$ to $Q_{12}$ of the counter 2 with the four less significant digital input data bits $D_4$ to $D_1$ after the digital input data bits $D_4$ to $D_1$ having been inverted through respective inverters 1011, 1012, 1015 and 1016, thereby to produce a coincidence signal upon coincidence occurring in the comparison and a delay circuit 1016 for delay only of the leading edge of the output of the comparator 1015 for a predetermined time (e.g. for a clock pulse duration), the delayed output being supplied to the set input S of a flip-flop 102; reference numeral 103 denotes an all-"1"-comparator for detecting that all of the eight less significant bit outputs $Q_1$ to $Q_8$ of the counter 2 become logic "1's"; 104 denotes an all-"0"-comparator for detecting that all of the eight less significant bits $Q_1$ to $Q_8$ of the counter 2 become "0's"; 201 denotes an all-"1"-comparator for detecting that all of the eight more significant bits $D_{12}$ to $D_5$ of the digital input data become logic "1's"; and 202 denotes an all-"0"-comparator for detecting that all of the eight more significant bits $D_{12}$ to $D_5$ become logic "0's". Since the operations of the above enumerated circuit components are the same as those of the corresponding components shown in FIG. 4, description of the operation will be omitted. Further, the circuit arrangement connected to the outputs of the comparator 91, the RS flip-flop 102, the all-"1"-comparators 103; 201 and the all-"0"-comparators 104; 202 are made in the same manner as in the case of the D-A converter shown in FIG. 6. Therefore, illustration and description thereof will be unnecessary.

In the case of the D-A converter shown in FIG. 9, the single count cycle of the counter 2 is divided into $2^4 = 16$ elementary or sub-periods with the result that the pulse repetition frequency is about 16-th times as high as that of the hitherto known converter. In more detail, assuming that clock pulse P has frequency of 2 MHz and that a 12-bit counter is employed, then the repetition frequency $f_1$ in the hitherto known system such as shown in FIG. 1 will be:

$$f_1 = \frac{P}{2^{12}} = \frac{2 \times 10^6}{4096} \approx 488.3 \, Hz$$

In contrast, the repetition frequency $f_2$ of the system shown in FIG. 9 will be:

$$f_2 = \frac{P}{2^8} = \frac{2 \times 10^6}{256} = 7812.5 \, Hz$$

Thus, $$\frac{f_2}{f_1} = \frac{7812.5}{488.3} \approx 16$$

Such a high repetition frequency permits the time constant to be made even smaller, which in turn increases the response speed of the analog output, while the ripple component is remarkably reduced in the analog output.

We claim:

1. A digital-to-analog converter of the pulse width modulation type comprising a clock pulse generator; a counter of plural-bit capacity coupled to the output of said clock pulse generator for counting the output clock pulses therefrom and for producing a carry-out signal when the count content of said counter becomes zero;
input terminals for the supply of input digital data bits to be converted into an analog signal provided in number corresponding to the bit capacity of said counter;
a flip-flop having a set input, a reset input and an output terminal; an integrator connected to the output terminal of said flip-flop for integrating the pulse widths of the output signal from said flip-flop;
wherein the bits of said counter are classified into two groups of a predetermined number of more significant bits and of the remaining number of less significant bits, while the digital input data bits are classified correspondingly into two groups of a predetermined number of more significant bits and of the remaining number of less significant bits;

first means coupled between said less significant bit terminals of said counter, said digital data input terminals for said more significant bits and said reset input for controlling said flip-flop to divide the counting cycle period of said counter into $2^m$ elementary sub-periods, where m represents the number of said less significant bits at said digital data input terminals and to allocate a certain number of pulses to each of said elementary sub-periods in dependence on the data value of said more significant bits at said digital data input terminals; and second means connected to the more significant and less significant bit terminals and the carry-out output terminal of said counter, to said digital data input terminals for said less significant bits and to the set input of said flip-flop for controlling the setting of said flip-flop to provide the pulses in said elementary sub-periods under the control of said first means and to provide additional correction elementary pulses to said flip-flop to be allocated to selected ones of said elementary sub-periods in dependence on the data value of said less significant bits of said digital input data.

2. A digital-to-analog converter as set forth in claim 1, wherein said first means includes first comparator means coupled between said digital data input terminals for said more significant bits, the less significant bit terminals of said counter and the reset input terminal of said flip-flop for comparing said more significant bits of said digital input data with said less significant bits of said counter thereby to produce an output signal upon coincidence being found in said comparison, said output signal being applied to said reset input of said flip-flop; and wherein said second means includes second comparator means coupled between said digital data input terminals for said less significant bits and the more significant bit terminals of said counter for comparing said less significant bits of said digital input data with said more significant bits of said counter thereby producing an output signal upon coincidence being found in said comparison; a second flip-flop coupled between the output of said second comparator means and said carry-out output terminal of said counter and adapted to be set and reset by the output from said second comparator means and said carry-out output of said counter, respectively; third comparator means coupled to the less significant bit terminals of said counter for producing an output signal when said less significant bits of said counter take first predetermined values, fourth comparator means coupled to said less significant bit terminals of said counter for producing an output signal when said less significant bits of said counter take second predetermined values; and circuit means coupled to a non-inverted output and an inverted output of said second flip-flop, the outputs of said third and fourth comparator means and said set input terminal of said first-mentioned flip-flop for producing a logical product from said non-inverted output of said second flip-flop as well as a logical product from said inverted output of said second flip-flop and the output of said fourth comparator means, said logical product signals being supplied to the set input of said first-mentioned flip-flop.

3. A digital-to-analog converter as set forth in claim 2, wherein said second comparator means includes inverter means coupled to said digital data input terminals for said less significant bits thereby to invert the values of said less significant bits; and a comparator coupled to the inverted output of said inverter means and said more significant bits of said counter for comparing said inverted output with said more significant bits of said counter thereby to produce an output signal upon coincidence being found in said comparison.

4. A digital-to-analog converter as set forth in claim 2, wherein said third comparator means includes a first comparator for producing an output signal in response to all of said less significant bits of said counter being logic "1's", and wherein said fourth comparator means includes a second comparator for producing an output signal in response to all of said less significant bits of said counter being logic "0's".

5. A digital-to-analog converter as set forth in claim 3, wherein delay means is provided for delaying only the leading edge of said output signal from said comparator for a duration corresponding to a predetermined number of clock pulses.

6. A digital-to-analog converter, comprising: a clock pulse generator; a counter of plural-bit capacity coupled to the output of said clock pulse generator for counting the output clock pulses therefrom and for producing a carry-out signal when the count contents of said counter becomes zero; input terminals for digital data bits provided in number corresponding to the bit capacity of said counter; wherein the bits of said counter are classified into two groups of a predetermined number of more significant bits and of the remaining number of less significant bits, while the digital input data bits are classified correspondingly into two groups of a predetermined number of more significant bits and of the remaining number of less significant bits; first comparator means coupled between said digital data input terminals for said more significant bits and said less significant bit outputs of said counter for comparing said more significant bits of said digital input data with said less significant bits of said counter thereby to produce an output signal upon coincidence being found in said comparison; second comparator means coupled between said digital data input terminals for said less significant bits and said more significant bit outputs of said counter for comparing said less significant bits of said digital input data with said more significant bits of said counter after either one of said less and more significant bits have been inverted, thereby to produce an output signal upon coincidence being found in said comparison; a first flip-flop coupled to the output of said second comparator means and said carry-out output of said counter and adapted to be set and reset by the output of said second comparator means and said carry-out output of said counter; third comparator means for producing an output when all of said less significant bits output from said counter are logic "1's"; fourth comparator means for producing an output signal when all of said less significant bits output from said counter are logic "0's"; circuit means coupled to a non-inverted output and an inverted output of said first flip-flop, and to outputs of said third and fourth comparator means for producing a logical product from said non-inverted output of said first flip-flop and the output of said third comparator means as well as a logical product from the inverted output of said first flip-flop and the output of said fourth comparator means thereby to produce an output signal of combined logical product output signals; a second flip-flop coupled to the outputs of said circuit means and said first comparator means and adapted to be set and reset by the outputs from said circuit means and said first comparator means, respectively, and an integrator coupled to the output of said second flip-flop to integrate said output from said second flip-flop.

7. A digital-to-analog converter as set forth in claim 6, wherein said second comparator means includes inverter means coupled to said digital data input terminals for said less significant bits thereby to invert the values of said less significant bits; and a comparator coupled to the inverted output of said inverter means and said more significant bits of said counter thereby to produce an output signal upon coincidence being found in said comparison.

8. A digital-to-analog converter as set forth in claim 6, wherein said third comparator means includes a first AND circuit while said fourth comparator means includes a NOR circuit, and wherein said circuit means includes a second AND circuit coupled to the output of said first AND circuit and the non-inverted output of said first flip-flop thereby to produce a logical product thereof; a third AND circuit coupled to the output of said NOR circuit and the inverted output of said first flip-flop thereby to produce a logical product thereof, and an OR circuit coupled to the outputs of said second and third AND circuits and the set input of said second flip-flop for producing a logical sum from the outputs of said second and third AND circuits to be supplied to said set input of said second flip-flop.

9. A digital-to-analog converter as set forth in claim 7, wherein delay means is provided for delaying only the leading edge of said output signal from said comparator for a duration corresponding to a predetermined number of clock pulses.

10. A digital-to-analog converter as set forth in claim 9, wherein said delay means includes a D flip-flop coupled to said clock pulse generator circuit and said comparator for receiving outputs therefrom, and an AND circuit coupled to said D flip-flop and said comparator for producing a logical products of the outputs therefrom, thereby to delay only the leading edge of the output from said comparator for a duration corresponding to a predetermined number of clock pulses.

11. A digital-to-analog converter of a pulse width modulation type including a clock pulse generator circuitry; a counter of a plural-bit capacity coupled to the output of said clock pulse generator circuit for counting the output clock pulses therefrom and adapted to produce a carry-out signal when the count contents of said counter becomes zero; input terminals for digital data bits provided in number corresponding to the bit capacity of said counter; a flip-flop having a set input, a reset input and an output terminal; and an integrator circuit connected to the output terminal of said flip-flop for integrating the output signal from said flip-flop; wherein the bits of said counter are classified into two groups of a predetermined number of more significant bits and of the remaining number of less significant bits, while the digital input data bits being classified correspondingly into two groups of a predetermined number of more significant bits and of the remaining number of less significant bits; further comprising first means coupled between said less significant bit terminals of said counter and said digital data input terminals for said more significant bits for dividing a counting cycle period of said counter into elementary sub-periods in number of $2^m$ where m represents the number of said less significant bits at said digital data input terminals and for distributing pulses among said elementary sub-periods in dependence on the data values of said more significant bits at said digital data input terminals; second means coupled between the more significant bit terminals and the carry-out output terminal of said counter, and said digital data input terminals for said more significant bits for determining selectively said elementary sub-periods in which an elementary pulse has been placed and in which an additional correction elementary pulse is to be placed in dependence on data value of said less significant bits of said digital input data, thereby to place said elementary pulse in the selected ones of said elementary sub-periods; and preference means coupled between the outputs of said first and second means, said digital data input terminals for said more significant bits and the set and the reset inputs of said flip-flop for supplying the outputs of said first and second means to the set and reset inputs of said flip-flop, wherein said preference means is adapted to select either one of said outputs of said first and second means in dependence on the data value of said more significant bits at said digital data input terminals when both of said outputs are simultaneously produced from said first and second means thereby to supply the selected one of said outputs to said flip-flop.

12. A digital-to-analog converter as set forth in claim 11, wherein said first means includes first comparator means coupled between said digital data input terminals for said more significant bits, the less significant bit terminals of said counter and the reset input terminal of said flip-flop for comparing said more significant bits of said digital input data with said less significant bits of said counter thereby to produce an output signal upon coincidence being found in said comparison, said output signal being applied to said reset input of said flip-flop; and wherein said second means includes second comparator means coupled between said digital data input terminals for said less significant bits and the more significant bit terminals of said counter for comparing said less significant bits of said digital input data with said more significant bits of said counter thereby producing an output signal upon coincidence being found in said comparison; a second flip-flop coupled between the output of said second comparator means and said carry-out output terminal of said counter and adapted to be set and reset by the output from said second comparator means and said carry-out output of said counter; third comparator means coupled to the less significant bit terminals of said counter for producing an output signal when said less significant bits of said counter take first predetermined values; fourth comparator means coupled to said less significant bit terminals of said counter for producing an output signal when said less significant bits of said counter take second predetermined values; and circuit means coupled to a non-inverted output and an inverted output of said second flip-flop, the outputs of said third and fourth comparator means and said set input terminal of said flip-flop for producing a logical product from said non-inverted output of said second flip-flop and the output of said third comparator means as well as a logical product from said inverted output of said second flip-flop and the output of said fourth comparator means, said logical product signals being supplied to the set input of said flip-flop.

13. A digital-to-analog converter as set forth in claim 11, wherein said preference circuit means comprises first comparator means coupled to said digital data input terminals for said more significant bits for producing an output signal when said more significant bits take first predetermined values; second comparator means coupled to said digital data input terminals for said more significant bits for producing an output signal when said more significant bits take second predetermined values; simultaneous signal detector circuitry coupled to the outputs of said first and second means for producing an output signal corresponding to a logical product of the output signals from said first and second means when both of said output signals are produced simultaneously; inverter means for inverting the output signal of said detector circuitry; first circuit means coupled to the outputs of said inverter means and said second means for producing a logical product of said outputs; second circuit means coupled to the output of said inverter means and said first means for producing a logical product of said outputs; third circuit means coupled to the outputs of said first comparator means and said simultaneous signal detector circuitry for producing a logical product of said outputs; fourth circuit means coupled to the outputs of said second comparator means and said simultaneous signal detector circuitry for producing a logical product of said outputs, fifth circuit means coupled to the outputs of said first and third circuit means and the set input of flip-flop for producing a logical sum of said outputs of said first and third circuit means, said logical sum signal being supplied to the set input of said flip-flop; and sixth circuit means coupled to the outputs of said second and fourth circuit means and the set input of said flip-flop for producing a logical sum of said outputs from said second and fourth circuit means, said logical sum signal being supplied to the reset input of said flip-flop.

14. A digital-to-analog converter, comprising: a clock pulse generator; a counter of a plural-bit capacity coupled to the output of said clock pulse generator for counting the output clock pulses therefrom and adapt to produce a carry-out signal when the count contents of said counter becomes zero; input terminals for digital data bits provided in number corresponding to the bit capacity of said counter; wherein the bits of said counter are classified into two groups of a predetermined number of more significant bits and of the remaining number of less significant bits, while the digital input data bits being classified correspondingly into two groups of a predetermined number of more significant bits and of the remaining number of less significant bits; first comparator means coupled between said digital data input terminals for said more significant bits and said less significant bit outputs of said counter for comparing said more significant bits of said digital input data with said less significant bits of said counter thereby to produce an output signal upon coincidence being found in said comparison; second comparator means coupled between said digital data input terminals for said less significant bits and said more significant bit outputs of said counter for comparing said less significant bits of said digital input data with said more significant bits of said counter after either one of said less and more significant bits having been inverted, thereby to produce an output signal upon coincidence being found in said comparison; a first flip-flop coupled to the output of said comparator means and said carry-out output of said counter and adapted to be set and reset by the output of said comparator means and said carry-out output of said counter; third comparator means for producing output when all of said less significant bits output from said counter are logic "1's"; fourth comparator means for producing output signal when all of said less significant bits output from said counter are logic "0's"; first circuit means coupled to a non-inverted output and an inverted output of said first flip-flop and outputs of said third and fourth comparator means for producing a logical product from said non-inverted output of said first flip-flop and the output of said third comparator means as well as a logical product from the inverted output of said first flip-flop and the output of said fourth comparator means thereby to produce an output signal of combined logical product output signals; fifth comparator means coupled to said digital data input terminals for said more significant bits for producing an output signal when said more significant bits take first predetermined values; sixth comparator means coupled to said digital data input terminals for said more significant bits for producing an output signal when said more significant bits take second predetermined values; simultaneous signal detector circuit coupled to the outputs of said fifth and sixth means for producing an output signal corresponding to a logical product of the output signals from said fifth and sixth means when both of said output signals are produced simultaneously; inverter means for inverting the output signal of said detector circuit; second circuit means coupled to the outputs of said inverter means and said first circuit means for producing a logical product of said outputs; third circuit means coupled to the output of said inverter means and said second circuit means for producing a logical product of said outputs; fourth circuit means coupled to the outputs of said fifth comparator means and said simultaneous signal detector circuit for producing a logical product of said outputs; fifth circuit means coupled to the outputs of said sixth comparator means and said simultaneous signal detector circuit for producing a logical product of said outputs, sixth circuit means coupled to the outputs of said second and fourth circuit means for producing a logical sum of said outputs of said second and fourth circuit means; seventh circuit means coupled to the outputs of said third and fifth circuit means for producing a logical sum of said outputs from said third and fifth circuit means, said logical sum signal being supplied to the reset input of said flip-flop; a second flip-flop coupled to the outputs of said sixth and seventh circuit means to be set and reset by said sixth and seventh circuit means; and an integrator circuit coupled to the output of said second flip-flop to integrete the output thereof.

15. A digital-to-analog converter as set forth in claim 1, further comprising: preference means coupled to the outputs of said first and second means, to said digital data input terminals for said more significant bits and to the set and the reset inputs of said flip-flop for supplying the outputs of said first and second means to the set and reset inputs of said flip-flop, wherein said preference means is adapted to select either one of said outputs of said first and second means in dependence on the data value of said more significant bits at said digital data input terminals when both of said outputs are simultaneously produced from said first and second means thereby to supply the selected one of said outputs to said flip-flop.

16. A digital-to-analog converter as set forth in claim 15, wherein said first means includes first comparator means coupled between said digital data input terminals for said more significant bits, the less significant bit terminals of said counter and the reset input terminal of said flip-flop for comparing said more significant bits of said digital input data with said less significant bits of said counter thereby to produce an output signal upon coincidence being found in said comparison, said output signal being applied to said reset input of said flip-flop; and wherein said second means includes second comparator means coupled between said digital data input terminals for said less significant bits and the more significant bit terminals of said counter for comparing said less significant bits of said digital input data with said more significant bits of said counter thereby producing an output signal upon coincidence being found in said comparison; a second flip-flop coupled between the output of said second comparator means and said carry-out output terminal of said counter and adapted to be set and reset by the output from said second comparator means and said carry-out output of said counter; third comparator means coupled to the less significant bit terminals of said counter for producing an output signal when said less significant bits of said counter take first predetermined values; fourth comparator means coupled to said less significant bit terminals of said counter for producing an output signal when said less significant bits of said counter take second predetermined values; and circuit means coupled to a non-inverted output and an inverted output of said second flip-flop, the outputs of said third and fourth comparator means and said set input terminal of said flip-flop for producing a logical product from said non-inverted output of said second flip-flop and the output of said third comparator means as well as a logical product from said inverted output of said second flip-flop and the output of said fourth comparator means, said logical product signals being supplied to the set input of said flip-flop.

17. A digital-to-analog converter as set forth in claim 15, wherein said preference circuit means comprises first comparator means coupled to said digital data input terminals for said more significant bits for producing an output signal when said more significant bits take first predetermined values; second comparator means coupled to said digital data input terminals for said more significant bits for producing an output signal when said more significant bits take second predetermined values; simultaneous signal detector circuitry coupled to the outputs of said first and second means for producing an output signal corresponding to a logical product of the output signals from said first and second means when both of said output signals are produced simultaneously; inverter means for inverting the output signal of said detector circuitry; first circuit means coupled to the outputs of said inverter means and said second means for producing a logical product of said outputs; second circuit means coupled to the output of said inverter means and said first means for producing a logical product of said outputs; third circuit means coupled to the outputs of said first comparator means and said simultaneous signal detector circuitry for producing a logical product of said outputs; fourth circuit means coupled to the outputs of said second comparator means and said simultaneous signal detector circuitry for producing a logical product of said outputs, fifth circuit means coupled to the outputs of said first and third circuit means and the set input of flip-flop for producing a logical sum of said outputs of said first and third circuit means, said logical sum signal being supplied to the set input of said flip-flop; and sixth circuit means coupled to the outputs of said second and fourth circuit means and the set input of said flip-flop for producing a logical sum of said outputs from said second and fourth circuit means, said logical sum signal being supplied to the reset input of said flip-flop.

18. A digital-to-analog converter of a pulse width modulation type comprising: a clock pulse generator; a counter of a plural-bit capacity coupled to the output of said clock pulse generator for counting the output clock pulses therefrom and adapted to produce a carry-out signal when the count contents of said counter becomes zero so that a counting cycle period is repeated, said counter having bit terminals which are classified into two groups of a predetermined number of more significant bits and of the remaining number of less significant bits;

input terminals for the supply of digital input data bits to be converted into analog signal provided in number to correspond to the bit capacity of said counter, the digital input data bits being classified correspondingly into two groups of a predetermined number of more significant bits and of the remaining number of less significant bits;

a flip-flop having a set input, a reset input terminal and an output terminal; an integrator connected to the output terminal of said flip-flop for integrating pulse widths of the output signal from said flip-flop;

first means coupled between said less significant bit terminals of said counter and said digital data input terminals for said more significant bits for generating reset pulses at least one of which is provided in each of elementary sub-periods which are formed by the counting cycle period of said counter into $2^m$ where m represent the number of said less significant bits of said digital data input terminals; and second means connected to the more significant and less significant bit terminals, the carry-out output terminal of said counter and said digital data input terminals for said more significant bits for generating set pulses, at least one of which is provided in each of said elementary sub-periods, said set and reset pulses being supplied to the set and reset input terminals of said flip-flop so as to cause generation of first kind output pulses and second kind output pulse at the output terminal of said flip-flop, said first kind pulses being distributed in each of said elementary sub-periods and the pulse width of each said first kind pulse being determined in dependence on the data values of said more significant bits at said digital data input terminals, and said second kind pulses being selectively provided to selected one or more of said elementary sub-periods for increasing by one bit the pulse width of the distributed first kind pulse in each said selected sub-period, the position of said second kind pulse being determined in dependence on data of said less significant bits of said digital input data.

19. A digital-to-analog converter as set forth in claim 18, wherein said first means includes first comparator for comparing said more significant bits of said digital input data with said less significant bits of said counter thereby to produce an output signal upon coincidence being found in said comparison, said output signal being applied to said reset input terminal of said flip-flop as reset pulse therefor; and wherein said second means includes: second comparator for comparing said less significant bits of said digital input data with said more significant bits of said counter thereby to produce an output signal upon coincidence being found in said comparison; a second flip-flop coupled between the output of said second comparator and said carry-out output terminal of said counter and adapted to be set and reset by the output from said second comparator and said carry-out output of said counter; third comparator coupled to the less significant bit terminals of said counter for producing an output signal when said less significant bits of said counter take first predetermined values, fourth comparator coupled to said less significant bit terminals of said counter for producing an output signal when said less significant bits of said counter take second predetermined values; and logic circuit means coupled with a non-inverted output and an inverted output of said second flip-flop and the outputs of said third and fourth comparator for producing a logical product from said non-inverted output of said second flip-flop as well as a logical product from said inverted output of said second flip-flop and the output of said fourth comparator, said logical product signals produced by said logic circuit means being supplied to the input terminal of said flip-flop.

20. A digital-to-analog converter as set forth in claim 19, wherein said second comparator includes inverter means coupled to said digital data input terminals for said less significant bits thereby to invert the values of said less significant bits; and a comparator coupled to the inverted output of said inverter means and said more significant bits of said counter for comparing said inverted output with said more significant bits of said counter thereby to produce an output signal upon coincidence being found in said comparison.

21. A digital-to-analog converter as set forth in claim 19, wherein said third comparator includes a first comparator for producing an output signal in response to all of said less significant bits of said counter being logic "1's", and wherein said fourth comparator means includes a second comparator for producing an output signal in response to all of said less significant bits of said counter being logic "0's".

22. A digital-to-analog converter of a pulse width modulation type comprising: a clock pulse generator; a counter of a plural-bit capacity coupled to the output of said clock pulse generator for counting the output clock pulses therefrom and adapt to produce a carry-out signal when the count contents of said counter become zero, so that counting cycle period is repeated and is classified into two groups of a predetermined number of more significant bits; input terminals for the supply of digital input data bits to be converted into analog signal provided in number to correspond to the bit capacity of said counter, the digital input data bits being classified correspondingly into two groups of a predetermined number of more significant bits and of the remaining number of less significant bits; first comparator means including first comparator coupled between said digital data input terminals for said more significant bits and said less significant bit outputs of said counter for comparing said more significant bits of said digital input data with said less significant bits of said counter thereby to produce an output signal upon coincidence being found in said comparison; second comparator means including second comparator coupled between said digital data input terminals for said less significant bits and said more significant bit outputs of said counter for comparing said less significant bits of said digital input data with said more significant bits of said counter after either one of said less and more significant bits having been inverted, thereby to produce an output signal upon coincidence being found in said comparison; a first flip-flop coupled to the output of said comparator means and said carry-out output of said counter and adapted to be set and reset by the output of said comparator means and said carry-out output of said counter; third comparator means for producing output when all of said less significant bits output from said counter are logic "1's"; fourth comparator means for producing output signal when all of said less significant bits output from said counter are logic "0's"; logic circuit means coupled to a non-inverted output and an inverted output of said first flip-flop, outputs of said third and fourth comparator means for producing a logical product from said non-inverted output of said first flip-flop and the output of said third comparator means as well as a logical product from the inverted output of said first flip-flop and the output of said fourth comparator means thereby to produce an output signal of combined logical product output signals; a second flip-flop coupled to the outputs of said logic circuit means and said first comparator means and adapted to be set and reset by the outputs from said circuit means and said first comparator means, and an integrator circuitry coupled to the output of said second flip-flop to integrate said output from said second flip-flop; the values of the higher rank group bits of said digital input data comprising the combinations of "0" and "1".

23. A digital-to-analog converter as set forth in claim 18, wherein said second means includes second comparator coupled between said digital data input terminals for said less significant bits and the more significant bit terminals of said counter for comparing said less significant bits of said digital input data with said more significant bits of said counter thereby producing an output signal upon coincidence being found in said comparison; circuit means coupled between said first comparator of said first means; said second means and said set and reset input of said flip-flop for supplying the output of said first and second means to the set and reset inputs of said flip-flop.

24. A digital-to-analog converter of a pulse width modulation type comprising:

a clock pulse generator for generating clock pulses;

a digital counter having a counting capacity of n-bits where n is an integer larger than one, for operatingly counting the clock pulses supplied from said generator so as to periodically produce at an output terminal thereof a carryout pulse at every moment when count contents of said counter becomes zero due to further counting of one bit after full counting of the n-bit capacity, so that a unit counting cycle period is repeated, said counter having bit output terminals of n representing respectively of the respective bits of the counter, so that the count contents of the respective bits by the counter are output from the bit output terminals;

signal input terminals in number of l supplied with input digital signal of l-bits to be converted into analog signal, the first m terminals of which represent the more significant first m digits of the input digital signal and the remaining (l-m) terminals of which represent the less significant (l-m) digits of the input digital signal, where l is an integer and not larger than n and m is an integer less than l and larger than one;

a flip-flop having a set and a reset input terminals and an output terminal for operatively producing at the output terminal thereof an output pulse which commences and terminates in response to signals supplied to the set and reset input terminals, respectively;

an integrator for integrating the output pulses supplied from the output terminal of said flip-flop supplied from the output terminal of said flip-flop so as to produce an analog signal the magnitude of which corresponds to the amount of integration of the pulse widths of the output pulses supplied from said flip-flop;

first means for generating reset pulses to be fed to said flip-flop in such a manner that at least one reset pulse is placed in each of elementary sub-periods in number of $2^m$ which sub-periods are formed by division of the unit counting cycle period into $2^m$; and second means for generating set pulses to be fed to said flip-flop in such a manner that at least one set pulse is placed in each of said elementary sub-periods;

the numbers and places of said set and reset pulses in the respective elementary sub-periods being varied in accordance with the value of the input digital signal so that a first and kind pulse and a second kind pulse are obtained through the flip-flop by the respective set and reset pulses in the respective sub-periods, the first kind pulse being commonly provided in the respective sub-periods, the pulse width thereof being varied in accordance with the value of the more significant first m digits of the input digital signal, and the second kind pulse having a unit pulse width for the purpose of compensating one bit and being selectively provided in the respective sub-periods in accordance with the value of the least significant last (l-m) digits of the input digital signal.

25. A digital-to-analog converter according to claim 24 which further comprises preference determining means supplied with the outputs of said first and second means and the more significant first m digits of the input digital signal for providing priority to one of the outputs from the first and second means against the other when both of the outputs of the first and second means are simultaneously produced to thereby allow the selected one of the outputs of the first and second means to be transmitted to said flip-flop.

26. In a digital-to-analog converter of a pulse width modulation type including:

a clock pulse generator for generating clock pulses;

a digital counter having a counting capacity of n-bits where n is an integer larger than one, for operatingly counting the clock pulses supplied from said generator so as to periodically produce at an output terminal thereof a carryout pulse at every moment when count contents of said counter becomes zero due to further counting of one bit after full counting of the n-bit capacity, so that a unit counting cycle period is repeated, said counter having bit output terminals of n representing respectively of the respective bits of the counter, so that the count contents of the respective bits by the counter are output from the bit output terminals;

signal input terminals in number of l supplied with input digital signal of l-bits to be converted into analog signal, the first m terminals of which represent the more significant first m digits of the input digital signal and the remaining (l-m) terminals of which represent the less significant (l-m) digits of the input digital signal, where l is an integer and not larger than n and m is an integer less than l and larger than one;

a flip-flop having a set and a reset input terminals and an output terminal for operatively producing at the output terminal thereof an output pulse which commences and terminates in response to signals supplied to the set and reset input terminals, respectively; and an integrator for integrating the output pulses supplied from the output terminal of said flip-flop so as to produce an analog signal the magnitude of which corresponds to the amount of integration of the pulse widths of the output pulses supplied from said flip-flop;

the improvement which comprises first means for generating reset pulses for said flip-flop in such a manner that at least one reset pulse is placed in each of elementary sub-periods in number of $2^m$ which sub-periods are formed by division of the unit counting cycle period into $2^m$; and second means for generating set pulses for said flip-flop in such a manner that at least one set pulse is placed in each of said elementary sub-periods, the numbers and places of said set and reset pulses in the respective elementary sub-periods being varied in accordance with the value of the input digital signal so that a first and kind pulse and a second kind pulse are obtained through the flip-flop by the respective set and reset pulses in the respective sub-periods, the first kind pulse being commonly provided in the respective sub-periods, the pulse width thereof being varied in accordance with the value of the most significant first m digits of the input digital signal, and the second kind pulse having a unit pulse width for the purpose of compensating one bit and being selectively provided in the respective sub-periods in accordance with the value of the least significant last (l-m) digits of the input digital signal.

* * * * *